United States Patent
Takenaka et al.

(10) Patent No.: US 8,057,072 B2
(45) Date of Patent: Nov. 15, 2011

(54) LIGHT-EMITTING MODULE AND ILLUMINATION APPARATUS

(75) Inventors: Erika Takenaka, Yokohama (JP); Kozo Ogawa, Yokosuka (JP); Keiichi Shimizu, Yokohama (JP); Hiroaki Watanabe, Odawara (JP); Akimichi Takahashi, Yokohama (JP); Shinji Nogi, Tokyo (JP); Shinichi Kumashiro, Yokohama (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 82 days.

(21) Appl. No.: 12/634,710

(22) Filed: Dec. 10, 2009

(65) Prior Publication Data

US 2010/0149783 A1 Jun. 17, 2010

(30) Foreign Application Priority Data

Dec. 12, 2008 (JP) .................................. 2008-316717

(51) Int. Cl.
*F21V 3/00* (2006.01)

(52) U.S. Cl. ............ 362/311.02; 362/311.01; 362/293; 362/84; 362/249.02; 257/98; 257/99

(58) Field of Classification Search ............. 362/311.02, 362/311.03, 293, 84, 294, 249.02; 257/98, 257/99, 100
See application file for complete search history.

(56) References Cited

U.S. PATENT DOCUMENTS

| | | | |
|---|---|---|---|
| 6,479,930 B1 | 11/2002 | Tanabe | |
| 7,615,921 B2 | 11/2009 | Kimura | |
| 7,740,373 B2 * | 6/2010 | Yoon et al. | 362/235 |
| 7,791,092 B2 * | 9/2010 | Tarsa et al. | 257/98 |
| 7,855,449 B2 * | 12/2010 | De Graff et al. | 257/714 |
| 2005/0248929 A1 | 11/2005 | Kawamura | |
| 2006/0124920 A1 | 6/2006 | Kimura | |
| 2006/0192483 A1 | 8/2006 | Nakanishi | |
| 2007/0023734 A1 | 2/2007 | Igarashi | |
| 2007/0159043 A1 | 7/2007 | Kubota | |
| 2008/0137008 A1 | 6/2008 | Rogojevic | |
| 2008/0191620 A1 | 8/2008 | Moriyama et al. | |
| 2009/0045722 A1 | 2/2009 | Bai | |
| 2009/0058278 A1 | 3/2009 | Ushikubo | |
| 2009/0189516 A1 | 7/2009 | Kurata | |

(Continued)

FOREIGN PATENT DOCUMENTS

CN 1094657 11/2002

(Continued)

OTHER PUBLICATIONS

Chinese Office Action issued in CN 200910261396.4 on Mar. 18, 2011.

(Continued)

*Primary Examiner* — Ali Alavi
(74) *Attorney, Agent, or Firm* — DLA Piper LLP US (57) ABSTRACT

A light-emitting module includes at least one light-emitting element provided on a mount surface of a substratum. A translucent member is provided so as to face the mount surface of the substratum. The translucent member is separated from the light-emitting element and contains a phosphor material that converts a wavelength of light emitted by the light-emitting element. A frame having heat conducting properties is interposed between the substratum and the translucent member. The frame surrounds the light-emitting element. The frame includes an opening that leads light emitted by the light-emitting element to the translucent member, and a heat conductor thermally connected to the translucent member. The heat conductor includes a heat radiator exposed outside of the translucent member.

14 Claims, 8 Drawing Sheets

U.S. PATENT DOCUMENTS

| | | | |
|---|---|---|---|
| 2009/0212696 A1 | 8/2009 | Terao |
| 2009/0230853 A1 | 9/2009 | Kanai |
| 2010/0039023 A1 | 2/2010 | Rogojevic |

FOREIGN PATENT DOCUMENTS

| | | |
|---|---|---|
| CN | 1934721 | 3/2007 |
| CN | 1945099 | 4/2007 |
| CN | 1992364 | 7/2007 |
| CN | 101084585 | 12/2007 |
| CN | 201003739 | 1/2008 |
| EP | 1 850 399 | 10/2007 |
| JP | 3-119573 | 12/1991 |
| JP | H05-152609 | 6/1993 |
| JP | 2002-057376 | 2/2002 |
| JP | 2003-068111 | 3/2003 |
| JP | 2004-193357 | 7/2004 |
| JP | 2008-147610 | 6/2008 |
| JP | 2008-218238 | 9/2008 |
| JP | 2008-227412 | 9/2008 |

OTHER PUBLICATIONS

English Translation of Chinese Office Action issued in CN 200910261396.4 on Mar. 18, 2011.
English Language Abstract of CN 101084585 published Dec. 5, 2007.
English Language Abstract of CN 1992364 published Jul. 4, 2007.
English language abstract of JP-H05-152609.
Machine English language translation of JP-H05-152609.
English language abstract of JP-2004-193357.
Machine English language translation of JP-2004-193357.
English language abstract of JP-2003-068111.
Machine English language translation of JP-2003-068111.
English language abstract of JP-3-119573.
Image File Wrapper of U.S. Appl. No. 12/581,911 electronically captured on Apr. 19, 2011.
Image File Wrapper of U.S Appl. No. 12/641,841 electronically captured on Apr. 19, 2011.
English Language Abstract of JP 2008-227412 Published on Sep. 25, 2008.
English Language Translation of JP 2008-227412 Published on Sep. 25, 2008.
English Language Abstract of JP 2002-057376 Published on Feb. 22, 2002.
English Language Translation of JP 2002-057376 Published on Feb. 22, 2002.
Office Action issued in CN 200910179891 mailed Jan. 19, 2011.
English Language Abstract of CN 1094657 published Nov. 20, 2002.
Image File Wrapper of U.S. Appl. No. 13/045,787 electronically captured on Apr. 19, 2011.
Chinese Office Action issued in CN 200910211992.1 on Dec. 31, 2010.
English Language Translation of Chinese Office Action issued in CN 200910211992.1 on Dec. 31, 2010.
English Language Abstract of CN 201003739 published on Jan. 9, 2008.
English Translation of CN 1945099 published Apr. 4, 2007.
Image File Wrapper of U.S. Appl. No. 12/581,911 as of Apr. 19 to May 6, 2011.
English language abstract of JP-2008-218238.
Machine English language translation of JP-2008-218238.
English language abstract of JP-2008-147610.
Machine English language translation of JP-2008-147610.
Notice of Allowance issued in related U.S. Appl. No. 12/581,911 on Jul. 8, 2011.

\* cited by examiner

LIGHT-EMITTING MODULE AND ILLUMINATION APPARATUS

CROSS-REFERENCE TO RELATED APPLICATIONS

This application is based upon and claims the benefit of priority from prior Japanese Patent Application No. 2008-316717, filed Dec. 12, 2008, the entire contents of which are incorporated herein by reference.

BACKGROUND OF THE INVENTION

1. Field of the Invention

The present invention relates to a light-emitting module that uses a light-emitting diode chip, for example, as a light source, and more specifically to a structure for maintaining favorable luminous efficacy by suppressing increase in temperature of a light-emitting diode chip. The present invention further relates to an illumination apparatus on which the light-emitting module is mounted on the apparatus main body.

2. Description of the Related Art

For example, light-emitting diodes have higher efficiency and longer life spans than existing light sources such as fluorescent lamps and incandescent lamps. With improvement in luminous efficacy of light-emitting diodes, various kinds of illumination apparatus that use light-emitting diodes as light sources have recently been commercialized.

A light-emitting module employing a light-emitting diode as a light source comprises a light-emitting diode chip that emits blue light, and a transparent sealing member containing yellow phosphor particles. The sealing member encases the light-emitting diode chip. The blue light emitted by the light-emitting diode chip excites phosphor particles when passing through the sealing member. Thereby, the blue light is wavelength-converted by the phosphor particles, and white light is radiated outside the light-emitting module.

In the conventional light-emitting module, heat is generated by loss caused when blue light is wavelength-converted by phosphor particles. Thereby, the phosphor particles increase in temperature, and the light-emitting diode chip also increase in temperature. The increase in temperature of the light-emitting diode chip causes decrease in luminous efficacy of the light-emitting diode chip, and sufficient optical output is prevented from being achieved.

To address this problem, in the illumination apparatus disclosed in Japanese Patent KOKAI Publication No. 2008-218238, a translucent panel including a fluorescent film is provided away from a plurality of light-emitting diodes. The translucent panel is formed of glass superior in heat radiation properties to resin, and includes a storing concave portion on a plane facing the light-emitting diodes. The fluorescent film is formed by applying a fluorescent substance to the storing concave portion.

According to the above-described configuration, since the fluorescent film is separated from the light-emitting diodes, even if heat is generated when light from the light-emitting diodes is wavelength-converted, the heat is not easily transferred to the light-emitting diodes. Further, the heat generated during wavelength conversion can be emitted outside of the illumination apparatus from the translucent panel. Accordingly, decrease in luminous efficacy of the light-emitting diodes is suppressed, and optical output is improved.

According to the illumination apparatus disclosed in the above-described Japanese Patent KOKAI Publication, the translucent panel including the fluorescent film is supported by a frame of the illumination apparatus body at an outer peripheral portion of the translucent panel away from the fluorescent film. In the above-described configuration, much of the heat generated by the fluorescent film during wavelength conversion is emitted only from the surface of the translucent panel, and the heat is easily trapped in the storing concave portion of the translucent panel. Accordingly, the above-described configuration is susceptible to improvement regarding how to emit heat caused by wavelength conversion efficiently.

A luminescent apparatus disclosed in Japanese Patent KOKAI Publication No. 2008-147610, for example, comprises a substratum including a plurality of light-emitting elements mounted thereon, a translucent phosphor sheet containing a phosphor material, and a frame interposed between the substratum and the phosphor sheet. The frame surrounds the light-emitting elements individually.

This luminescent apparatus is capable of wavelength-converting light radiated from the light-emitting elements using the phosphor sheet, and emitting the wavelength-converted light from the surface of the phosphor sheet. This luminescent apparatus, however, merely disclose efficiently converting light from the light-emitting apparatus using the phosphor sheet and efficiently reflecting light traveling back toward the substratum from the phosphor sheet outside the luminescent apparatus. In other words, the above-described document does not mention a concrete structure for emitting heat generated when the phosphor sheet has generated heat due to loss caused by wavelength conversion.

BRIEF SUMMARY OF THE INVENTION

An object of the present invention is to obtain a light-emitting module capable of suppressing increase in temperature of a light-emitting element by emitting heat generated by a fluorescent material outside a translucent member, and achieving sufficient optical Output.

Another object of the present invention is to obtain an illumination apparatus capable of achieving sufficient brightness by mounting a light-emitting module having high luminous efficacy.

In order to achieve the above-described object, a light-emitting module according to the first aspect of the present invention comprises: a substratum including a mount surface; at least one light-emitting element provided on the mount surface of the substratum; a translucent member provided so as to face the mount surface of the substratum, the translucent member being separated from the light-emitting element and containing a phosphor material that converts a wavelength of light emitted by the light-emitting element; and a frame having heat conducting properties and interposed between the substratum and the translucent member so as to surround the light-emitting element. The frame includes an opening that leads light emitted by the light-emitting element to the translucent member, and a heat conductor thermally connected to the translucent member. The heat conductor includes a heat radiator exposed outside of the translucent member.

According to the first aspect of the present invention, the light-emitting module performs general lighting by radiating light toward a floor from a ceiling. More specifically, the light-emitting module can be applied to light sources of small illumination apparatuses for general house illumination purposes, or light sources of relatively big illumination apparatuses for business purposes in offices or various other institutions. Furthermore, an electric-bulb-type LED lamp may be formed by providing a light-emitting module inside an electric-bulb-shaped translucent cover including a base.

In the first aspect of the present invention, the substratum is a constituent element for supporting the light-emitting diode chip as the light-emitting element, and should desirably be formed of a flexible material. The substratum may be formed of a metal material having excellent heat conducting properties, such as aluminum and copper, or may be formed of a non-metal material such as a glass epoxy material, a paper phenolic material, and a glass composite. Moreover, the substratum may be formed of ceramics.

Further, since the substratum forms a planar module including a plurality of light-emitting diode chips systematically arranged at intervals, the substratum should preferably have a quadrilateral shape such as a square or a rectangular, a polygonal shape such as a hexagon, a circular shape, or an oval shape. Furthermore, since the substratum forms a linear module including a plurality of light-emitting diode chips arranged in a linear shape, the substratum may have a long elongated shape. In other words, the substratum may have an arbitrary shape according to desired light intensity distribution.

Meanwhile, on the substratum on which a wiring pattern is formed on the mount surface, light-emitting diode chips may be mounted on the wiring pattern. Considering mounting of the light-emitting diode chips, the substratum should desirably, but not essentially, have a wiring pattern. There is no limit on the means for mounting the light-emitting diode chips on the substratum, either.

According to the first aspect of the present invention, the light-emitting diode chip may be formed of one chip, or formed by combining a plurality of chips. When yellow phosphor particles are used as a fluorescent material, blue light-emitting diode chips that emit blue light should desirably be used, in order to obtain white light. The light-emitting diode chips are not limited to blue light-emitting diode chips. For example, by using red light-emitting diode chips that emit red light, or green light-emitting diode chips that emit green light, light of colors other than white may be obtained.

A portion or all of the light-emitting diode chips may be arranged in a matrix on the mount surface of the substratum, or may be systematically arranged in a predetermined order in a staggered or radial pattern. The shape of the region in which the light-emitting diode chips are arranged should desirably be a quadrilateral such as a square or a rectangular, a polygon such as a hexagon, a circle, or an oval. In other words, the region may be formed in a shape capable of effectively arranging the light-emitting diode chips, or in an arbitrary shape according to desired light intensity distribution.

In the first aspect of the present invention, the light-emitting diode chips should desirably be arranged at the bottom of the frame that is formed in a pyramid or cone shape. Further, the frame should preferably have an opening, to which light emitted from the light-emitting diode chips is led, in a position facing the bottom. More specifically, in order to obtain luminous intensity distribution that is rotationally symmetrical with respect to the light-emitting diode chips, the frame should preferably be formed in a shape that coaxially surrounds the light-emitting diode chips and spreads toward the opening. The frame may be formed in any shape capable of obtaining desired luminous intensity distribution, and the shape of the frame is not specified.

Considering reflective properties of light, the frame may be formed of a white synthetic resin material having weather-resistant, heat-resistant, and electrical insulating properties, such as polybutylene terephthalate (PBT), or may be integrally formed using acrylic resin or ABS resin. The inner surface of the frame surrounding the light-emitting diode chip should preferably be coated in white so as to increase reflective properties of light. Instead of coating, by depositing a metal material, such as aluminum and silver, on the inner surface of the frame, or plating the inner surface of the frame, the inner surface of the frame may be formed as a mirror finished surface or a semi-mirror finished surface.

Moreover, when the frame is formed of a metal material such as aluminum and copper, the inner surface of the frame may be coated in white, or the frame may be processed so as to form the inner surface of the frame as a mirror-finished surface or a semi-mirror finished surface. The frame should preferably, but not essentially, have light reflective properties.

The frame may be provided according to the number of the light-emitting diode chips. More specifically, in a light-emitting module including a plurality of light-emitting diode chips, a plurality of frames may be provided so as to correspond to the respective light-emitting diode chips, or a plurality of frames may be provided so as to correspond to a plurality of chip groups, in each of which a plurality of light-emitting diode chips are combined. Not all the frames need to be formed in the same shape, and frames having different shapes may be combined.

Further, one frame common to a plurality of light-emitting diode chips or a plurality of chip groups may be provided. Moreover, one frame may be provided with respect to one light-emitting diode chip.

In the first aspect of the present invention, a void is secured between the translucent member and the light-emitting diode chip. The translucent member contains yellow phosphors as a phosphor material when the light-emitting diode chip radiates blue light, for example. Thereby, when the blue light passes through the translucent member, yellow phosphors that have absorbed a portion of the blue light emits yellow light at the time of wavelength conversion. Thereby, the blue light and the yellow light are mixed into white light, and the white light is radiated outside the translucent member.

The translucent member includes a base formed of a transparent or semitransparent material, such as silicon resin and epoxy resin, and a phosphor material contained in the base. The translucent member should preferably be a flexible sheet. The sheet does not need to be flexible, and may be rigid. Further, light control means such as a lens that controls luminous intensity distribution may be added to the translucent member. The phosphor material may be yellow phosphor particles mixed into the translucent member, for example, or may be stacked as a wavelength conversion layer on the surface of the translucent member.

The translucent member is provided so as to correspond to the opening of the frame. When the frame includes more than one openings, the translucent member may be formed to have a size that covers the more than one openings. More specifically, the translucent member may be formed as one sheet, such that the sheet covers the more than one openings all together.

According to the first aspect of the present invention, the heat conductor of the frame is a constituent element for emitting heat generated by phosphor particles during wavelength conversion outside the light-emitting module. The heat conductor should preferably be formed to be integrally embedded into the translucent member, for example, such that heat generated by the fluorescent material is favorably received from the translucent member. More specifically, when the translucent member is formed of resin, this can be attained by integrally molding the heat conductor of the frame in forming the translucent member. Further, a through hole may be formed in the translucent member, and the heat conductor of the frame may be engaged in the through hole. When the translucent member is formed by combining a plurality of elements, the heat conductor of the frame may be interposed between adjacent elements. Accordingly, the means for thermally connecting the heat conductor of the frame to the translucent member is not specified to embedding.

The frame should preferably be capable of transferring heat of the phosphor material transferred to the heat conductor further to the substratum, and emitting the heat outside the light-emitting module from the substratum. The frame does not essentially need to transfer heat of the phosphor material to the substratum. For example, the frame may be formed of a metal material such as aluminum, and heat of the phosphor material may be emitted outside the light-emitting module from the translucent member and the frame.

In the second aspect of the present invention, a frame is thermally connected to the substratum. According to the second aspect of the present invention, heat generated by a phosphor material can be transferred from the frame to the substratum, and emitted outside the light-emitting module from the substratum.

In the third aspect of the present invention, a heat conductor of a frame protrudes toward the opposite side of a substratum from an edge of an opening of the frame. According to the third aspect, since the heat conductor faces the translucent member, thermal connection between the heat conductor and the translucent member can be easily performed.

In the fourth aspect of the present invention, a heat conductor of a frame is continuous in the peripheral direction of an opening and surrounds a translucent member. According to the fourth aspect, the contact area between the heat conductor and the translucent member can be sufficiently secured. Thereby, heat generated by a phosphor material is effectively transferred from the translucent member to the heat conductor.

According to the fifth aspect of the present invention, a frame forms a receptacle that contains a light-emitting element in cooperation with the substratum and the translucent member, and a translucent sealing member is charged into the receptacle. The receptacle should desirably be formed airtight so as to secure dust-resistant and moisture-resistant properties of a light-emitting diode chip, and maintain electrical insulation of a charging portion of the light-emitting diode chip. By charging a sealing member into the receptacle, the light-emitting diode chip is covered with the sealing member. Accordingly, the light-emitting diode chip is reliably prevented from being soiled, and electrical insulating properties of the charging portion of the light-emitting diode chip are further increased.

In the sixth aspect of the present invention, the substratum and the translucent member have flexibility and the frame is elastically deformable. According to the sixth aspect, the light-emitting module can be bent in an arbitrary shape. Accordingly, the outer shape of the light-emitting module can be varied as desired.

As the substratum, a rigid-flex board obtained by combining a plurality of rigid substrates formed of film-like sheets and epoxy resin, for example, and a film-like flexible substratum connecting the rigid substrates may be used.

The translucent member may be formed of a flexible synthetic resin material, for example. Further, when the translucent member is divided into a plurality of elements, the elements may be bendably coupled so as to add flexibility to the translucent member.

The frame may be formed of a flexible synthetic resin material, for example. When the main part of the frame is formed of a rigid synthetic resin material or a metal material, the main part may be bendably formed in a grid pattern by making a plurality of holes in the main part of the frame.

When the frame is formed of a synthetic resin material, the frame becomes more easily bent by providing a plurality of voids inside the frame. The voids are not essential elements and may be excluded from the inside of the frame.

In order to achieve the above-described object, a light-emitting module according to the seventh aspect of the present invention comprises: a substratum including a mount surface; a plurality of light-emitting elements systematically arranged on the mount surface of the substratum; a translucent member provided so as to face the mount surface of the substratum, the translucent member being separated from the light-emitting elements and containing a phosphor material that converts a wavelength of light emitted by the light-emitting elements; and a frame having heat conducting properties and interposed between the substratum and the translucent member. The frame includes a plurality of cell blocks surrounding the light-emitting elements, and each of the cell blocks includes an opening that leads light emitted by the light-emitting elements to the translucent member, and a heat conductor thermally connected to the translucent member. The heat conductor includes a heat radiator exposed outside of the translucent member.

In the seventh aspect of the present invention, a plurality of cell blocks may be separated from one another or may be integrally coupled. When the cell blocks are separated from one another, heat conductors of adjacent cell blocks should abut one another so as to overlap one another.

According to the seventh aspect, heat generated by the phosphor material at the time of wavelength conversion is transferred to the heat conductors of the cell blocks, and is directly emitted from the heat radiators of the heat conductors to the outside of the translucent member. Further, the heat of the phosphor material is transferred from the heat conductors to the cell blocks, and can be emitted from the cell blocks.

In the eighth aspect of the present invention, the cell blocks are divided from one another and heat conductors of adjacent cell blocks abut one another. The translucent member includes a plurality of divided pieces divided so as to correspond to a plurality of cell blocks, and each of the divided pieces is thermally connected to the heat conductor of the cell block. According to the eighth aspect, the frame is bendable at the abutting portions of the heat conductors. Accordingly, the outer shape of the light-emitting module can be varied as desired.

In the ninth aspect of the present invention, the substratum and the translucent member have flexibility, and the frame is elastically deformable. In the ninth aspect, the light-emitting module can be bent as desired.

In the tenth aspect of the present invention, the translucent member is an integral structure and includes a plurality of through holes through which the heat conductors of the cell blocks penetrate. According to the tenth aspect, heat radiators of the heat conductors can be easily exposed to the outside of the translucent member. Thereby, heat of a phosphor material transferred to the heat conductors can be effectively emitted outside the translucent member. Further, since the through holes are systematically arranged at intervals, the through holes become similar in configuration to perforations. Accordingly, the integrally formed translucent member can be bent along the through holes.

In the eleventh aspect of the present invention, a frame includes a plurality of voids formed between cell blocks. According to the eleventh aspect, the frame can be more easily bent.

In order to achieve the above-described object, an illumination apparatus according to the twelfth aspect of the present invention comprises: an apparatus body; a light-emitting module supported by the apparatus body; and a lighting device configured to light the light-emitting module. The light-emitting module includes: (i) a substratum including a mount surface; (ii) at least one light-emitting element provided on the mount surface of the substratum; (iii) a translucent member provided so as to face the mount surface of the substratum, the translucent member being separated from the light-emitting element and containing phosphor particles that convert a wavelength of light emitted by the light-emitting element; and (iv) a frame having heat conducting properties and interposed between the substratum and the translucent member so as to surround the light-emitting element. The frame includes an opening that leads light emitted by the light-emitting element to the translucent member, and a heat conductor thermally connected to the translucent member, and the heat conductor includes a heat radiator exposed to the outside of the translucent member.

According to the twelfth aspect, the illumination apparatus is applicable to general house illumination purposes, or business purposes in offices or various other institutions. Further, one light-emitting module or a plurality of light-emitting modules may be combined with the apparatus body. In addition, the light-emitting module may be incorporated into the apparatus body after assembling a substratum including the light-emitting element mounted thereon, the translucent member, and the frame into one assembly, or the substratum, the translucent member, and the frame may be individually mounted on the apparatus body. The apparatus body should desirably be formed of a metal material having excellent heat conducting properties, such as steel plate, stainless steel, and aluminum. Further, the apparatus body may be formed of a synthetic resin material having heat-resistant, weather-resistant, and electrical insulating properties, such as polybutylene terephthalate (PBT).

The lighting device includes a lighting circuit that converts a 100-V alternating voltage into a 24-V direct voltage and supplies the converted voltage to the light-emitting element. The lighting device may be attached to the apparatus body, or may be provided in a place separated from the apparatus body, such as a ceiling. Further, the lighting device may have a lighting control function.

In the thirteenth aspect of the present invention, a spacer having heat conducting properties is interposed between an apparatus body and a substratum of a light-emitting module. According to the thirteenth aspect, heat of the light-emitting module is transferred from the spacer to the apparatus body, and can be emitted outside of an illumination apparatus from the apparatus body.

In the fourteenth aspect of the present invention, the substratum and a translucent member of the light-emitting module have flexibility, and a frame is elastically deformable.

According to the fourteenth aspect, the light-emitting module can be bent in an arbitrary shape. Thereby, the apparatus body supporting the light-emitting module can be formed with an original design incorporating curved and flat surfaces, for example.

According to the light-emitting module of the present invention, heat generated by a phosphor material at the time of wavelength conversion can be effectively emitted outside the translucent member. Thereby, luminous efficacy of the light-emitting element is increased, and a sufficient optical output is obtained.

According to the illumination apparatus of the present invention, it is possible to obtain sufficient brightness while suppressing decrease in luminous efficacy of the light-emitting module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, a light-emitting module and an illumination apparatus according to a first embodiment of the present invention will be described with reference to FIG. 1 to FIG. 6.

Figure 1:
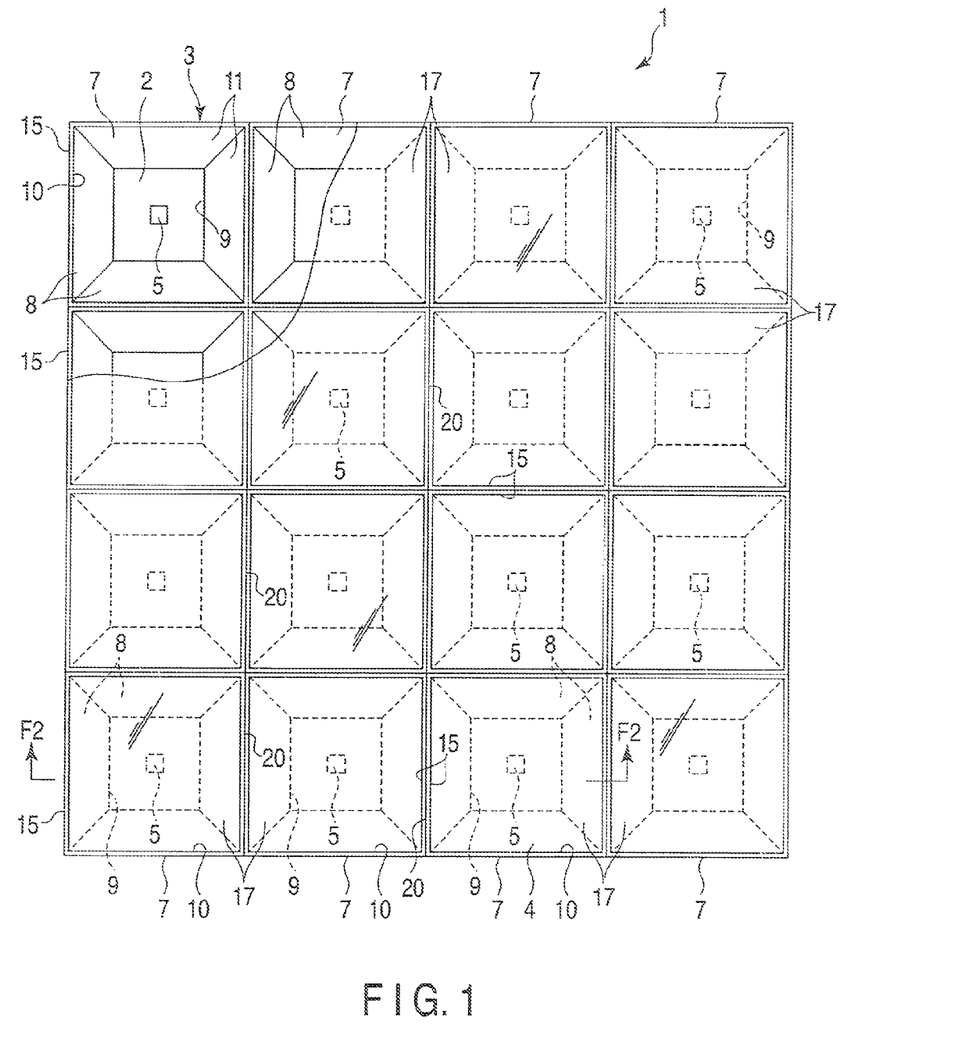
FIG. 1 is a plan view of a light-emitting module according to a first embodiment of the present invention.
Figure 2:
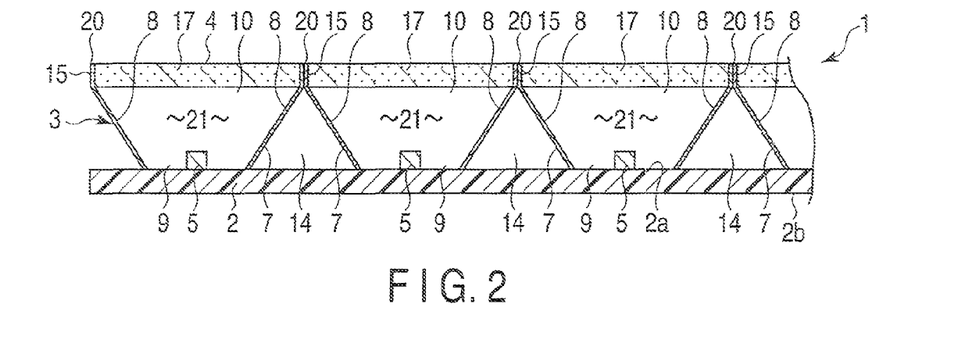
FIG. 2 is a cross-sectional view along line F2-F2 of FIG. 1.

FIG. 1 and FIG. 2 disclose a light-emitting module 1. The light-emitting module 1 comprises a substratum 2, a frame 3 and a translucent member 4.

The substratum 2 is a plate having an approximately square shape, for example, and is formed of a flexible material, such as epoxy resin. The substratum 2 includes a flat mount surface 2a and a back surface 2b positioned on the opposite side of the mount surface 2a.

A plurality of light-emitting diode chips 5 are provided on the mount surface 2a of the substratum 2. The light-emitting diode chips 5, which are examples of light-emitting elements, are systematically arranged in a matrix on the mount surface 2a. Further, a wiring pattern, not shown, is formed on the mount surface 2a. The light-emitting diode chips 5 are arranged on the wiring pattern, and are connected in series via the wiring pattern. The light-emitting diode chips 5 have the same properties. In the present embodiment, high-intensity and high-output blue light-emitting diode chips that emit blue light are used.

Figure 4:
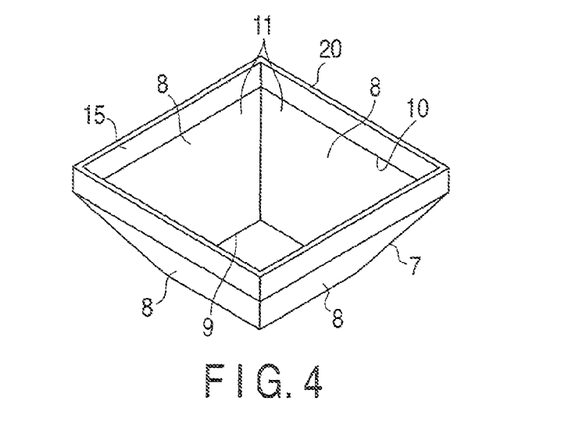
FIG. 4 is a perspective view of a cell block forming the frame, according to the first embodiment of the present invention.

The frame 3 is formed of a synthetic resin material having heat conducting and electrical insulating properties, such as white polybutylene terephthalate (PBT). The frame 3 is formed by combining a plurality of cell blocks 7. As shown in FIG. 4, each of the cell blocks 7 has a pyramid shape, and includes four thin peripheral walls 8. The peripheral walls 8 have flexibility. The peripheral walls 8 define a square first opening 9 and a square second opening 10 in cooperation with one another. The first opening 9 opens at one end of the cell block 7. The second opening 10 opens at the other end of the cell block 7 so as to face the first opening 9. The four peripheral walls 8 are inclined in a direction away from one another as the distance from the first opening 9 to the second opening 10 increases. This inclination makes the second opening 10 greater in size than the first opening 9. Further, the inner surfaces of the peripheral walls 8 are mirror-surface finished by depositing aluminum, for example, thereon. Accordingly, the inner surface of the peripheral wall 8 is a light reflective surface 11.

Figure 3:
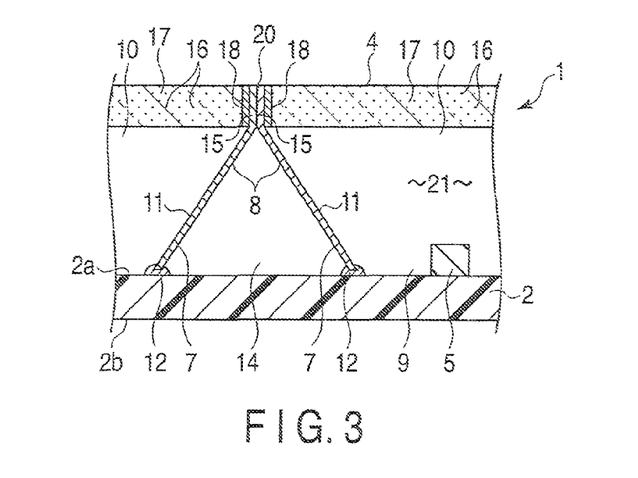
FIG. 3 is a cross-sectional view illustrating positional relationship between a translucent member and heat conductors of a frame, according to the first embodiment of the present invention.

As shown in FIG. 1 to FIG. 3, the cell blocks 7 are systematically arranged on the mount surface 2a of the substratum 2 so as to correspond to the respective light-emitting diode chips 5. The first opening 9 of each of the cell blocks 7 faces the mount surface 2a. The edges of the peripheral walls 8 defining the first opening 9 are fixed to the mount surface 2a via an adhering agent 12 formed of silicon resin or epoxy resin having heat-resistant and electrical insulating properties. This fixation allows the cell blocks 7 to be coupled to one another so as to, form the grid-patterned frame 3, and the light-emitting diode chip 5 to be located in the center of the first opening 9 of each of the cell blocks 7.

The four light reflective surfaces 11 of the cell block 7 surround the light-emitting diode chip 5. The light reflective surface 11 has a shape that spreads toward the light radiation direction from the back of the light-emitting diode chip 5. Accordingly, the light reflective surfaces 11 of the cell block 7 are configured such that light emitted by the light-emitting diode chip 5 is reflected toward the second opening 10 and luminous intensity distribution that is rotationally symmetrical with respect to the light-emitting diode chip 5 is obtained.

In the state where the cell blocks 7 are fixed to the mount surface 2a of the substratum 2, a plurality of voids 14 are formed between the peripheral walls 8 of adjacent cell blocks 7 and the substratum 2. The existence of the voids 14 allows the frame 3 coupling the cell blocks 7 to have flexibility. Thereby, the frame 3 can be bent in an arbitrary shape.

As shown in FIG. 2 to FIG. 4, each of the cell blocks 7 has a heat conductor 15. The heat conductor 15 is integrally formed at the edges of the peripheral walls 8 defining the second opening 10 of the cell block 7. The heat conductor 15 protrudes toward the opposite side of the substratum 2 from the edges of the peripheral walls 8 and is continuous with the peripheral direction of the second opening 10. Accordingly, the heat conductor 15 has a rectangular opening shape. The heat conductors 15 of adjacent cell blocks 7 abut each other so as to overlap with each other. Thereby, the heat conductors 15 of the cell blocks 7 are continuous with one another in a grid pattern.

As shown in FIG. 1 and FIG. 2, the translucent member 4 is arranged so as to face the mount surface 2a of the substratum 2. The translucent member 4 comprises a plurality of divided pieces 17 divided so as to correspond to the respective cell blocks 7. The divided piece 17 includes a base using transparent silicon resin, for example, and yellow phosphor particles 16 mixed into the base. The phosphor particles 16, which are examples of the phosphor material that converts blue light emitted by the light-emitting diode chips 5 into yellow light, are evenly dispersed into the base as a preferable example.

The divided piece 17 is a flexible rectangular sheet, and has a size that fits into the heat conductor 15 of the cell block 7. The divided piece 17 is fixed to the inside of the heat conductor 15 of the cell block 7 using the adhering agent 18 formed of silicon resin, for example, which has excellent heat conducting properties. This fixation allows the second opening 10 of the cell block 7 to be covered by the divided piece 17, and the heat conductor 15 of the cell block 7 to be thermally connected to the divided piece 17. Further, the heat conductors 15 abutting each other are interposed between adjacent divided pieces 17. Accordingly, the tip of the heat conductor 15 forms a heat radiator 20 that is exposed to the outside of the translucent member 4 from adjacent divided pieces 17. According to the present embodiment, the heat radiator 20 is located on the same plane as the surface of the translucent member 4.

As shown in FIG. 2, the translucent member 4 is away from the light-emitting diode chips 5. Further, the cell blocks 7 of the frame 3 are interposed between the mount surface 2a of the substratum 2 and the translucent member 4, and define a plurality of receptacles 21 in cooperation with the substratum 2 and the divided pieces 17. The receptacles 21 individually contain the light-emitting diode chips 5. The wiring pattern connected to the light-emitting diode chips 5 is exposed to the receptacles 21. In the present embodiment, the receptacles 21 are formed airtight. Thereby, the light-emitting diode chips 5 and the portions electrically connecting the light-emitting diode chips 5 and the wiring pattern are protected from dust or damp.

According to the first embodiment, by combining the substratum 2 on which the light-emitting diode chips 5 are mounted, the frame 3 including the cell blocks 7, and the translucent member 4 including the divided pieces 17, the light-emitting module 1 is formed in a flat shape. In the light-emitting module 1, the substratum 2 and the divided pieces 17 of the translucent member 4 are flexible, and the frame 3 also has flexibility. Thereby, the light-emitting module 1 is elastically deformable, and can be bent in an arbitrary shape.

Figure 5:
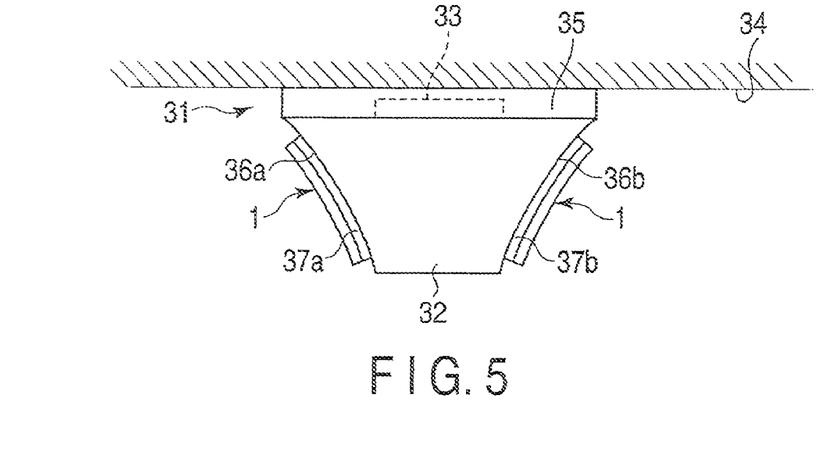
FIG. 5 is a front view of an illumination apparatus, to which the lighting module of FIG. 1 is applied, according to the first embodiment of the present invention.
Figure 6:
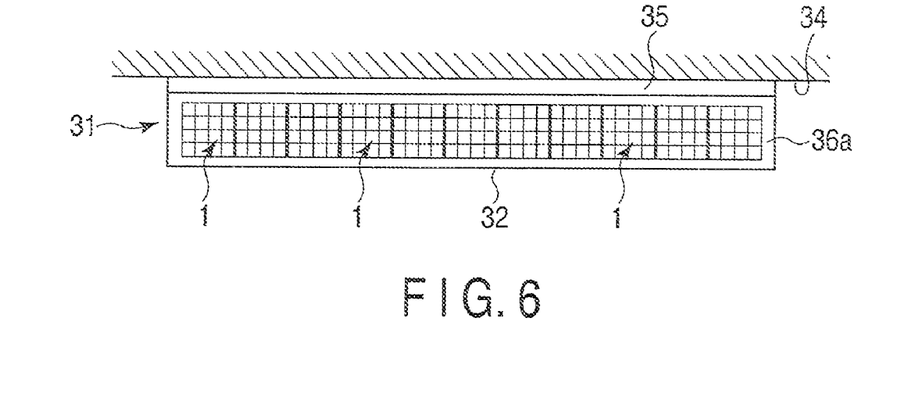
FIG. 6 is a side view of the illumination apparatus according to the first embodiment of the present invention.

The light-emitting module 1 with the above-described configuration can be applied to light sources for illumination apparatuses. FIG. 5 and FIG. 6 disclose an illumination apparatus 31 used for general lighting purposes in offices, for example. The illumination apparatus 31 comprises an apparatus body 32, a plurality of light-emitting modules 1, and a lighting device 33.

The apparatus body 32 comprises a body case 35. The body case 35 is formed by processing a coated steel plate, for example, and has an elongated shape that extends directly toward a ceiling 34 of an office. The body case 35 is surface-mounted on the ceiling 34 via a plurality of brackets. The body case 35 includes a pair of light-source supporters 36a and 36b. The light-source supporters 36a and 36b extend in the longitudinal direction of the body case 35, and are raised up so as to face the opposite side of each other with respect to the body case 35. Further, the light-source supporters 36a and 36b are curved in a circular arc so as to be away from each other as the distance to the ceiling 34 decreases.

The light-source supporters 36a and 36b of the body case 35 support the light-emitting modules 1 via spacers 37a and 37b. The spacers 37a and 37b are formed of a metal material having excellent heat conducting properties, such as aluminum and copper, and are curved in a circular arc along the light-sources supporters 36a and 36b.

As shown in FIG. 6, the light-emitting modules 1 are arranged in a line along the longitudinal direction of the body case 35. The back surface 2b of the substratum 2 of the light-emitting module 1 is adhered to the spacers 37a and 37b via an adhering agent or an adhering sheet formed of silicon resin or epoxy resin. The adhering agent or the adhering sheet has electrical insulating properties and excellent heat conducting properties.

Further, the substratum 2 of the light-emitting module 1 is fixed to the light-source supporters 36a and 36b of the body case 35 along with the spacers 37a and 37b using fixing means such as a plurality of screws. This fixation allows the light-emitting modules 1 to be curved in a circular arc along the light-source supporters 36a and 36b, and the substratum 2 of the light-emitting module 1 to be thermally connected to the apparatus body 32. Further, the light-emitting modules 1 supported by the apparatus body 32 are connected to each other in series.

As shown in FIG. 5, the lighting device 33 is contained inside the body case 35. The lighting device 33 includes a lighting circuit, which converts a 100-V alternating voltage into a 24-V direct voltage and supplies it to the light-emitting diode chips 5. The output terminal of the lighting circuit is led to the inside of the body case 35, and is connected to the input terminals of the light-emitting modules 1.

The illumination apparatus 31 with the above-described configuration may be mounted alone on the ceiling 34 of an office, or more than one illumination apparatuses 31 may be connected via feeding cables and mounted on the ceiling 34. When the illumination apparatus 31 is lighted, all the light-emitting diode chips 5 of the light-emitting modules 1 emit blue light. Much of the blue light radiated from the light-emitting diode chips 5 is directly led to the second openings 10 of the cell blocks 7, and the remaining light is reflected off the light reflective surfaces 11 of the cell blocks 7, and led to the second openings 10. The blue light led to the second openings 10 is made incident on the divided pieces 17 of the translucent member 4. A portion of the blue light made incident on the divided pieces 17 is absorbed by the yellow phosphor particles 16. The remaining blue light passes through the divided pieces 17 without being absorbed by the phosphor particles 16. The phosphor particles 16 that have absorbed the blue light are excited and emit yellow light after wavelength conversion. Thereby, the blue light and the yellow light are mixed into white light, and the white light is radiated outside the translucent member 4.

Accordingly, the light-emitting modules 1 radiate the white light according to desired light intensity properties from the ceiling 34 of the office to the floor. In the illumination apparatus 31 of the present embodiment, since the light-emitting modules 1 are arranged in a straight line, illumination is performed so as to provide horizontally oriented light intensity distribution.

According to the first embodiment of the present invention, when blue light radiated from the light-emitting diode chips 5 is wavelength-converted by the phosphor particles 16, loss is caused and the phosphor particles 16 generate heat. The heat of the phosphor particles 16 is dispersed into the divided pieces 17 of the translucent member 4.

The heat of the phosphor particles 16 dispersed into the divided pieces 17 is emitted outside the light-emitting modules 1 from the surfaces of the divided pieces 17. Further, since the divided pieces 17 are thermally connected to the heat conductors 15, the heat of the phosphor particles 16 is also transferred to the heat conductors 15. The heat radiators 20 of the heat conductors 15 are exposed to the outside of the translucent member 4. Thereby, the heat of the phosphor particles 16 transmitted to the thermal conductors 15 is directly emitted outside the light-emitting modules 1 from the heat radiators 20.

In addition, the heat of the phosphor particles 16 is transferred to the substratum 2 via the peripheral walls 8 of the cell blocks 7 from the heat conductor 15. The substratum 2 is thermally connected to the apparatus body 32. Thereby, the heat of the phosphor particles 16 is also emitted from the frame 3, which is a group of the cell blocks 7, and the apparatus body 32.

The light-emitting diode chips 5 involve heat generation at the time of lighting. The heat of the light-emitting diode chips 5 is transferred from the light reflective surfaces 11 of the cell blocks 7 to the divided pieces 17 of the translucent member 4, and emitted from the surfaces of the divided pieces 17 to the outside of the light-emitting modules 1. Meanwhile, the heat of the light-emitting diode chips 5 is transferred from the substratum 2 to the apparatus body 32, and is also emitted from the apparatus body 32.

According to the first embodiment of the present invention, the heat generated by the phosphor particles 16 due to the loss at the time of wavelength conversion can be effectively emitted from the frame 3 and the translucent member 4, and can be transferred from the frame 3 to the substratum 2 and emitted from the substratum 2. Moreover, the heat generated by the light-emitting diode chips 5 can be emitted from the translucent member 4 and the substratum 2.

Thereby, increase in temperature of the light-emitting diode chips 5 is suppressed, and luminous efficiency is favorably maintained. Therefore, sufficient light output can be obtained for general illumination purposes. Meanwhile, the light-emitting diode chips 5 have a longer lifespan, which makes it possible to provide the illumination apparatus 31 including the light-emitting modules 1 that are highly reliable.

Further, since the heat generated by the phosphor particles 16 can be emitted from the frame 3 and the substratum 2, the translucent member 4 containing the phosphor particles 16 can be formed of a resin material inferior to glass in heat radiating properties. Accordingly, there will be no limit on the material of the translucent member 4, and the cost of material can be reduced.

In addition, since the heat radiating properties of the light-emitting diode chips 5 and the phosphor particles 16 become favorable, and the necessity to add an expensive heatsink made of aluminum, for example, and fins for heat radiation to the light-emitting module 1 is eliminated. In other words, since heat sinks and fins for heat radiation can be eliminated from the light-emitting module 1, and the cost of the light-emitting module 1 can be reduced.

The light-emitting module 1 is elastically deformable, and can be bent in an arbitrary shape. Thereby, the light-emitting module 1 can be applied to light sources of illumination apparatuses in various shapes, and is rich in versatility. Moreover, the apparatus body 32, in which the light-emitting modules 1 are installed, can be formed with a unique design incorporating curved and flat surfaces. Accordingly, the illumination apparatus 31 can be obtained with various designs, which has conventionally been impossible due to the limitation on the shape of the light source. Accordingly, the flexibility in designing the illumination apparatus 31 increases and the design effect of the illumination apparatus 31 can be increased.

The present invention is not limited to the first embodiment, and can be embodied with various modifications within the spirit of the invention.

Figure 7:
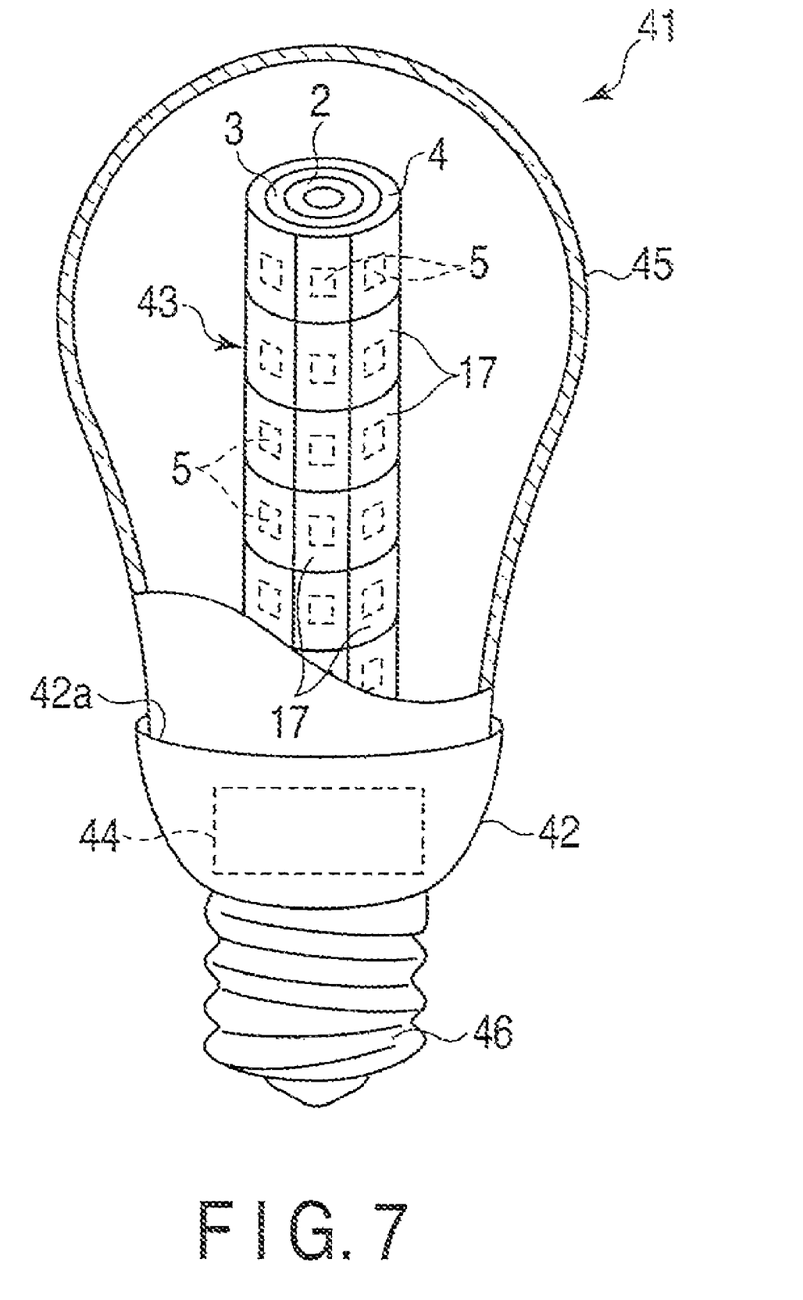
FIG. 7 is a perspective view of an illumination apparatus according to a second embodiment of the present invention.

For example, FIG. 7 discloses a light bulb type LED lamp 41 according to a second embodiment of the present invention. The LED lamp 41, which is an example of an illumination device, comprises an apparatus body 42, a light-emitting module 43, a lighting device 44, and a translucent cover 45. The apparatus body 42 has a semispherical shape including an opening 42a at one end. An E-type base 46 is attached to a top facing the opening 42a of the apparatus body 42.

The light-emitting module 43 is obtained by forming the light-emitting module 1 according to the first embodiment in a cylindrical shape, and has a basic configuration same as that of the light-emitting module 1. Accordingly, constituent elements same as those of the light-emitting module 1 will be denoted by the same reference numerals, and detailed descriptions of such elements will be omitted. One end of the cylindrical light-emitting module 43 is supported by the apparatus body 42. The light-emitting module 43 is arranged coaxially with the base 46, and protrudes from the opening 42a of the apparatus body 42. A plurality of light-emitting diode chips 5 included in the light-emitting module 43 are arranged at intervals in the axial direction and the peripheral direction of the light-emitting module 43. Accordingly, the light-emitting diode chips 5 radially radiate light toward the periphery of the light-emitting module 43.

The lighting device 44 is contained inside the apparatus body 42. The lighting device 44 is electrically connected to the light-emitting diode chips 5 and the base 46.

The translucent cover 45, which is an example of the translucent member, has a shape similar to that of a general incandescent glass bulb. The translucent cover 45 is formed of transparent silicon resin containing yellow phosphor particles, for example. The translucent cover 45 is supported by the apparatus body 42 so as to cover the light-emitting module 43.

In the LED lamp 41 with the above-described configuration, the blue light emitted by the light-emitting diode chips 5 is radially radiated from the cylindrical light-emitting module 43. A portion of the blue light is wavelength-converted by the phosphor particles when passing through the translucent cover 45, and becomes yellow light. Thereby, the yellow light and the blue light are mixed into white light, and the white light is evenly radiated to the periphery of the translucent cover 45.

Accordingly, the LED lamp 41 has luminous intensity distribution similar to that of general incandescent lamps, and can be used instead of the existing incandescent lamps.

Figure 8:
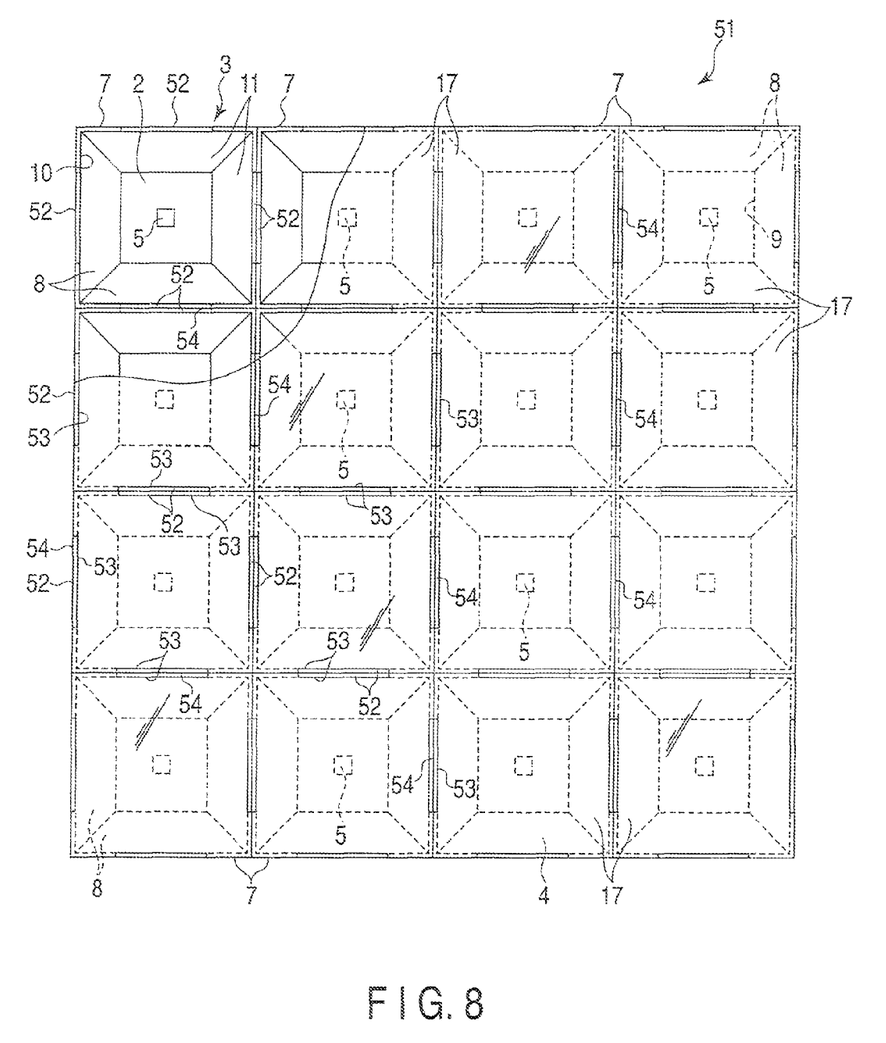
FIG. 8 is a plan view of a light-emitting module according to a third embodiment of the present invention.
Figure 9:
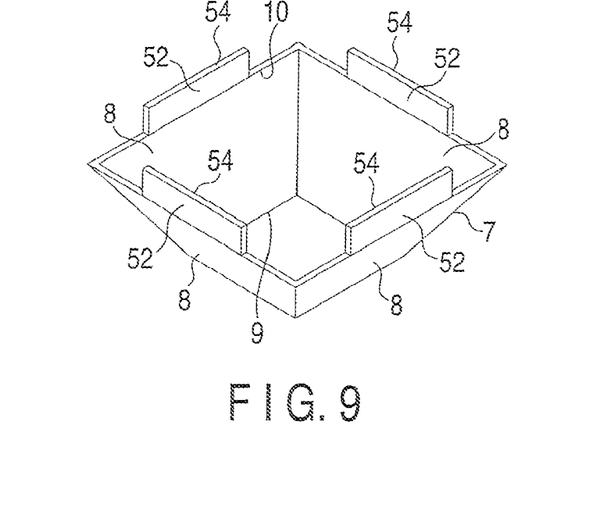
FIG. 9 is a perspective view of a cell block forming a frame, according to the third embodiment of the present invention.

FIGS. 8 and 9 disclose a light-emitting module 51 according to the third embodiment of the present invention. In the third embodiment, the shapes of cell blocks 7 of a frame 3 and divided pieces 17 of a translucent member 4 are different from those of the first embodiment. The other configurations of the light-emitting module 51 are the same as those of the first embodiment.

As shown in FIG. 9, the cell block 7 has four heat conductors 52. The heat conductors 52 are integrally formed at the edges of the peripheral walls 8 defining the second opening 10 of the cell block 7. The heat conductors 52 protrude toward the opposite side of the substratum 2 from the edges of the peripheral walls 8, and are arranged at intervals in the peripheral direction of the second opening 10. The heat conductors 52 of adjacent cell blocks 7 abut each other so as to overlap each other.

The divided pieces 17 of the translucent member 4 are flexible rectangular sheets. The outer peripheral edges of the divided pieces 17 overlap the edges of the peripheral walls 8 defining the second opening 10 of the cell block 7. The outer peripheral edges of adjacent divided pieces 17 abut each other. Four notches 53 are formed at the outer peripheral edges of the divided pieces 17. The notches 53 are arranged at intervals in the peripheral direction of the divided pieces 17 so as to correspond to the heat conductors 52 of the cell block 7.

The heat conductors 52 of the cell block 7 fit into the notches 53, and are fixed to the divided pieces 17 via an adhering agent. Further, the tips of the heat conductors 52 form heat radiators 54 exposed to the outside of the translucent member 4 from the notches 53. The heat radiators 54 are positioned on the same plane as the surface of the translucent member 4.

According to the third embodiment with the above-described configuration, the heat generated by phosphor particles at the time of wavelength conversion can be emitted from the heat radiators 54 of the cell blocks 7 and the frame 3, which is a group of the cell blocks 7. Accordingly, as in the case of the first embodiment, it is possible to suppress increase in temperature of the light-emitting diode chips 5, and favorably maintain luminous efficacy.

Figure 10:
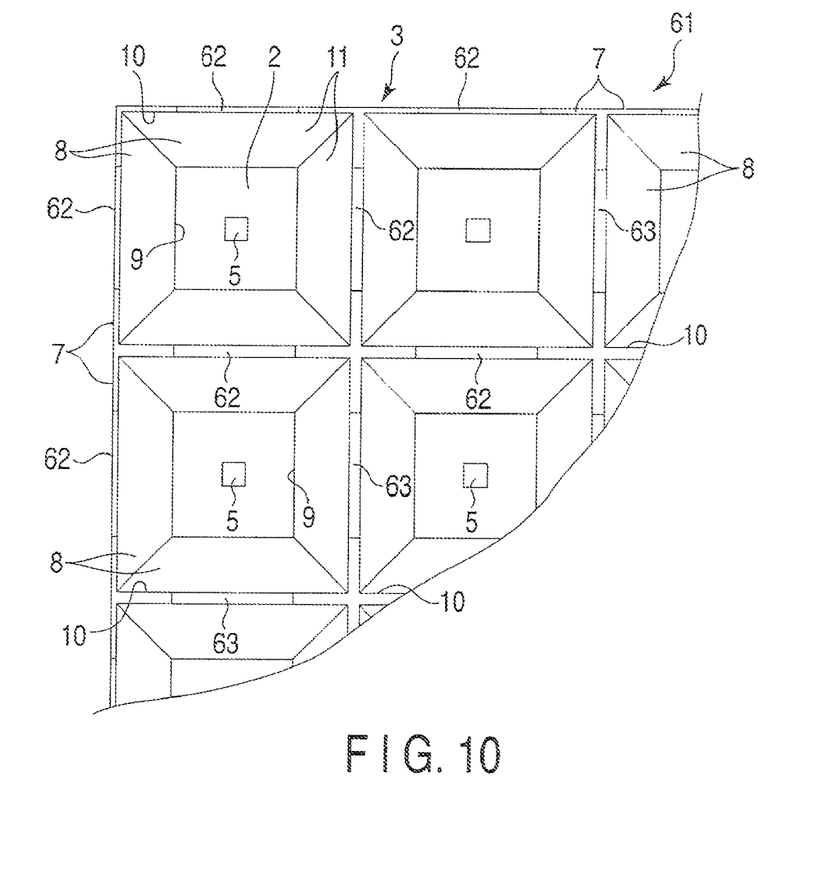
FIG. 10 is a plan view of a frame of a light-emitting module according to a fourth embodiment of the present invention.
Figure 11:
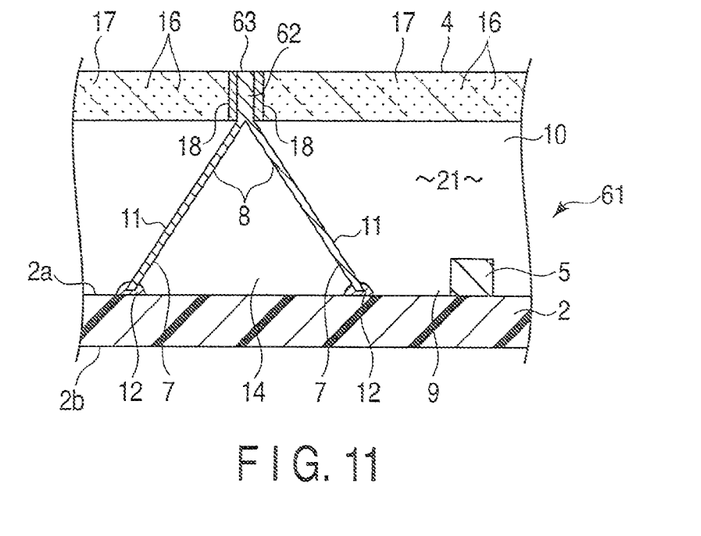
FIG. 11 is a cross-sectional view of the light-emitting module according to the fourth embodiment of the present invention.

FIGS. 10 and 11 disclose a light-emitting module 61 according to the fourth embodiment of the present invention. The fourth embodiment is different from the third embodiment in regard to a frame 3. The configuration of the light-emitting module 61 other than the frame 3 is basically the same as that of the third embodiment.

In the fourth embodiment, a plurality of cell blocks 7 are integrally formed. Thereby, the frame 3 is formed as an integral structure, and the edges of peripheral walls 8 defining a second opening 10 of the cell blocks 7 are made continuous in a grid pattern.

The cell block 7 includes four heat conductors 62. The heat conductors 62 are integrally formed at the edges of the peripheral walls 8 defining the second opening 10 of the cell block 7. The heat conductors 62 protrude toward the opposite side of the substratum 2 from the edges of the peripheral walls 8, and are arranged at intervals in the peripheral direction of the second opening 10. The heat conductors 62 of adjacent cell blocks 7 are integrally formed.

Further, the tips of the heat conductors 62 form heat radiators 63 exposed to the outside of the translucent member 4. The heat radiators 63 are positioned on the same plane as the surface of the translucent member 4.

Figure 12:
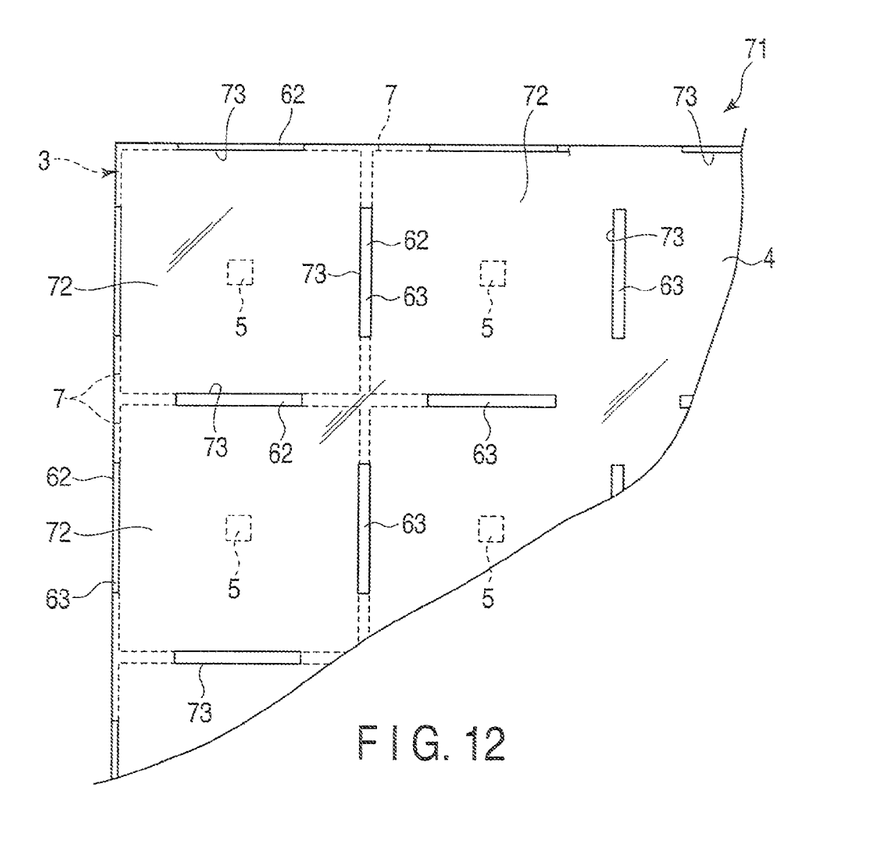
FIG. 12 is a plan view of a light-emitting module according to a fifth embodiment of the present invention.

FIG. 12 discloses a light-emitting module 71 according to the fifth embodiment of the present invention.

The fifth embodiment is different from the fourth embodiment in regard to a translucent member 4. The configuration of the light-emitting module 71 other than the translucent member 4 is basically the same as that of the fourth embodiment.

As shown in FIG. 12, the translucent member 4 is formed as a sheet-like integral structure having a size corresponding to a frame 3. The translucent member 4 has a plurality of light-emitting regions 72 corresponding to a plurality of cell blocks 7, and a plurality of slits 73. The slits 73, which are examples of through holes, penetrate the translucent member 4 in the thickness direction in positions corresponding to the outer peripheral parts of the light-emitting regions 72. Further, the slits 73 are systematically arranged at intervals. Accordingly, the slits 73 are similar in shape to perforations.

The heat conductors 62 of the cell blocks 7 are fit into the slits 73. The heat radiators 63 of the heat conductors 62 are exposed to the outside of the translucent member 4 from the slits 73.

According to the fifth embodiment, the heat generated by phosphor particles at the time of wavelength conversion can be transferred to the heat conductors 62 of the cell blocks 7, and can be emitted outside the light-emitting module 71 from the heat radiators 63. Further, the slits 73 formed in the translucent member 4 are systematically arranged in a pattern similar to perforations. Thereby, the integrally formed translucent member 4 can be easily bent along the slits 73, and the translucent member 4 can be formed to have a flexible configuration. Accordingly, even when the frame 3 is formed of a metal material such as aluminum, so as to increase heat radiation properties, the overall flexibility of the light-emitting module 71 is sufficiently secured.

Figure 13:
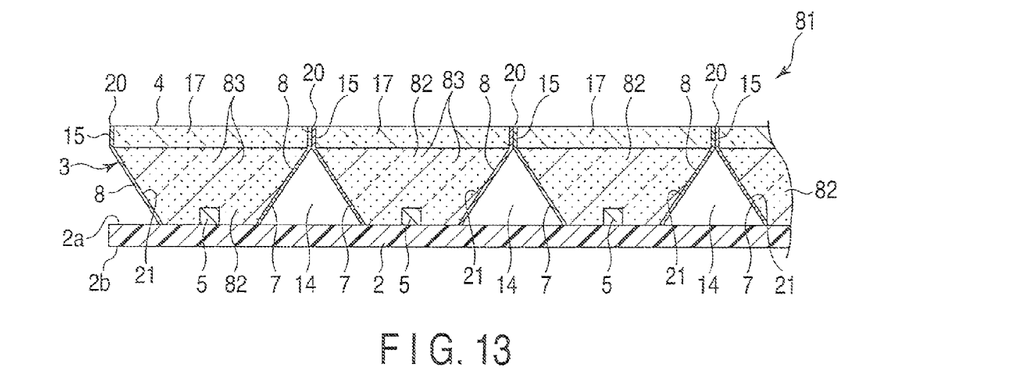
FIG. 13 is a cross-sectional view of a light-emitting module according to a sixth embodiment of the present invention.

FIG. 13 discloses a light-emitting module 81 according to the sixth embodiment of the present invention.

In the sixth embodiment, sealing members 82 are charged into the inside of a plurality of receptacles 21 defined by the substratum 2, the cell blocks 7, and the translucent member 4. The sealing member 82 is formed of a transparent silicon resin containing a light diffusing agent 83, for example. As the light diffusing agent 83, light diffusing fine particles, such as titanium oxide ($TiO_2$) and silica ($SiO_2$), are used. The light diffusing agent 83 is evenly dispersed into the inside of the sealing member 82.

The sealing members 82 are charged so as to fully fill the receptacles 21. Thereby, light-emitting diode chips 5, a wiring pattern, and portions electrically connecting the light-emitting diode chips 5 and the wiring pattern are covered with the sealing members 82.

According to the sixth embodiment, light radiated from the light-emitting diode chips 5 passes through the sealing members 82 containing the light diffusing agent 83. Thereby, light traveling toward the translucent member 4 from the light-emitting diode chips 5 is dispersed, and light reflected off the translucent member 4 and traveling back toward the substratum 2 is also dispersed. Accordingly, light of the light-emitting diode chips 5 having high directivity is evenly led to a wide range of the translucent member 4. Further, loss of light emitted from the light-emitting diode chips 5 can be suppressed to a low level, and light emitted from the light-emitting diode chips 5 is effectively taken outside the light-emitting module 81.

Moreover, light radiated from the light-emitting diode chips 5 is dispersed inside the sealing members 82 and mixed. Thereby, variation in color on the surface of the translucent member 4 is prevented, and luminance distribution of the surface of the translucent member 4 is equalized.

In addition, by setting the refractive index of the sealing member 82 to a value between the refractive index of the semiconductor light-emitting layer of the light-emitting diode chip 5 and the refractive index of the translucent member 4, the refractive index of a plurality of constituent elements positioned on an optical path extending from the light-emitting diode chip 5 to the translucent member 4 can be gradually decreased. Accordingly, light reflected off the sealing member 82 and the translucent member 4 and traveling back toward the substratum 2 can be reduced, and light reflected off the light-emitting diode chips 5 is effectively taken outside the light-emitting module 81.

In the sixth embodiment, the light-emitting diode chips 5 and the portions electrically connecting the light-emitting diode chips 5 and the wiring pattern are covered with the sealing members 82. Thereby, the light-emitting diode chips 5 are prevented from being soiled or damaged, and electrical insulating properties of the light-emitting diode chips 5 is further increased.

Moreover, when the sealing members 82 are charged into the receptacles 21, the peripheral walls 8 of the cell blocks 7 function as banks. Accordingly, a special constituent element for preventing leak of the sealing members 82 becomes unnecessary, and the configuration of the light-emitting module 81 can be simplified.

Figure 14:
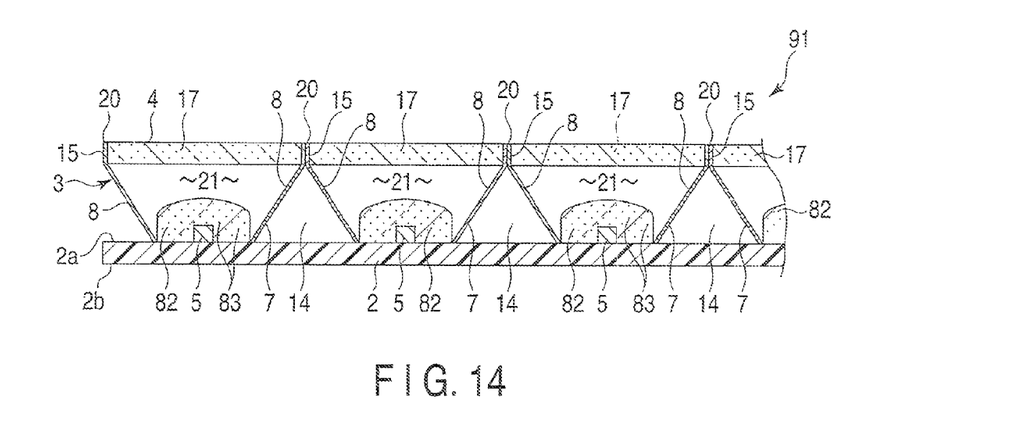
FIG. 14 is a cross-sectional view of a light-emitting module according to a seventh embodiment of the present invention.

FIG. 14 discloses a light-emitting module 91 according to the seventh embodiment of the present invention. According to the seventh embodiment, the sealing members 82 charged into the receptacles 21 covers only the light-emitting diode chips 5 and the portions electrically connecting the light-emitting diode chips 5 and the wiring pattern in a dome shape.

According to this configuration, the same advantage as that of the sixth embodiment can be obtained, while reducing the amount of use of silicon resin and light-diffusing agent 83, which are expensive. Accordingly, it is possible to provide a light-emitting module 91 that is effective in terms of cost.

In the present invention, the heat radiators of the heat conductors included in the frame may protrude from the surface of the translucent member. Thereby, the shading angle can be set by the tips of the heat radiators, and discomfort glare that is caused when a person looks up at the illumination apparatus is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-emitting module, comprising:
   a substratum including a mount surface;
   at least one light-emitting element provided on the mount surface of the substratum;
   a translucent member provided so as to face the mount surface of the substratum, the translucent member being separated from the light-emitting element and containing a phosphor material that converts a wavelength of light emitted by the light-emitting element; and
   a frame having heat conducting properties and interposed between the substratum and the translucent member so as to surround the light-emitting element, the frame including an opening that leads light emitted by the light-emitting element to the translucent member and a heat conductor thermally connected to the translucent member, the heat conductor including a heat radiator exposed outside of the translucent member.

2. The light-emitting module of claim 1, wherein the frame is thermally connected to the substratum.

3. The light-emitting module of claim 1, wherein the heat conductor of the frame protrudes toward an opposite side of the substratum from an edge of the opening.

4. The light-emitting module of claim 3, wherein the heat conductor of the frame is continuous with a peripheral direction of the opening and surrounds the translucent member.

5. The light-emitting module of claim 1, wherein the frame forms a receptacle that contains the light-emitting element in cooperation with the substratum and the translucent member, and a translucent sealing member is charged into the receptacle.

6. The light-emitting module of claim 1, wherein the substratum and the translucent member have flexibility and the frame is elastically deformable.

7. A light-emitting module, comprising:
a substratum including a mount surface;
a plurality of light-emitting elements systematically arranged on the mount surface of the substratum;
a translucent member provided so as to face the mount surface of the substratum, the translucent member being separated from the light-emitting elements and containing a phosphor material that converts a wavelength of light emitted by the light-emitting elements; and
a frame having heat conducting properties and interposed between the substratum and the translucent member, the frame including a plurality of cell blocks that surround the light-emitting elements, each of the cell blocks including an opening that leads light emitted by the light-emitting elements to the translucent member, and a heat conductor thermally connected to the translucent member, the heat conductor including a heat radiator exposed outside of the translucent member.

8. The light-emitting module of claim 7, wherein said plurality of cell blocks are divided from one another and the heat conductors of adjacent cell blocks abut one another, the translucent member includes a plurality of divided pieces divided so as to correspond to said plurality of cell blocks, and each of the divided pieces is thermally connected to the heat conductor of each of the cell blocks.

9. The light-emitting module of claim 7, wherein the substratum and the translucent member have flexibility and the frame is elastically deformable.

10. The light-emitting module of claim 7, wherein the translucent member is an integral structure and includes a plurality of through holes through which the heat conductors of said plurality of cell blocks penetrate.

11. The light-emitting module of claim 9, wherein the frame includes a plurality of voids formed between the cell blocks.

12. An illumination apparatus comprising:
an apparatus body;
a light-emitting module supported by the apparatus body; and
a lighting device configured to light the light-emitting module,
wherein the light-emitting module includes:
a substratum including a mount surface;
at least one light-emitting element provided on the mount surface of the substratum;
a translucent member provided so as to face the mount surface of the substratum, the translucent member being separated from the light-emitting element and containing a phosphor material that converts a wavelength of light emitted by the light-emitting element; and
a frame having heat conducting properties and interposed between the substratum and the translucent member so as to surround the light-emitting element, the frame including an opening that leads light emitted by the light-emitting element to the translucent member, and a heat conductor thermally connected to the translucent member, the heat conductor including a heat radiator exposed outside of the translucent member.

13. The illumination apparatus of claim 12, further comprising a spacer provided between the apparatus body and the substratum of the light-emitting module, the spacer having heat conducting properties.

14. The illumination apparatus of claim 12, wherein the substratum and the translucent member of the light-emitting module have flexibility and the frame is elastically deformable.

* * * * *